United States Patent [19]
Rante

[11] Patent Number: 4,566,325
[45] Date of Patent: Jan. 28, 1986

[54] HANDS-ON INSPECTION BOARD FOR PRINTED CIRCUIT CARDS

[76] Inventor: John Rante, 406 E. Ravine, Willow Springs, Ill. 60480

[21] Appl. No.: 691,423

[22] Filed: Jan. 14, 1985

[51] Int. Cl.⁴ .......................................... G01M 19/00
[52] U.S. Cl. ............................ 73/432 R; 324/73 PC; 248/287; 269/73
[58] Field of Search ............ 73/432 R, 432 V, 432 G; 33/1 BB, 1 M, 568; 350/531; 324/73 PC, 158 F; 248/DIG. 13, 287, 661, 542, 543; 269/73

[56] References Cited

U.S. PATENT DOCUMENTS

| | | | |
|---|---|---|---|
| 1,615,216 | 1/1927 | Cruger | 350/531 X |
| 1,680,547 | 8/1928 | Jury | 73/432 V |
| 3,039,604 | 6/1962 | Bickel et al. | 73/432 V X |
| 3,743,904 | 7/1973 | Wiesler et al. | 350/531 X |
| 3,744,891 | 7/1973 | Dennis et al. | 33/1 M X |
| 3,807,578 | 4/1974 | Nelson | 269/73 X |
| 3,844,461 | 10/1974 | Robison et al. | 33/1 M X |
| 3,918,167 | 11/1975 | Gerber | 269/73 X |
| 4,233,740 | 11/1980 | Bunn et al. | 248/DIG. 13 |
| 4,420,886 | 12/1983 | Amano | 33/1 M |
| 4,510,806 | 4/1985 | Jonisiewicz et al. | 73/432 R |

FOREIGN PATENT DOCUMENTS

| | | | |
|---|---|---|---|
| 56640 | 4/1980 | Japan | 350/531 |
| 785919 | 12/1980 | U.S.S.R. | 324/73 PC |
| 890568 | 12/1981 | U.S.S.R. | 324/158 F |

OTHER PUBLICATIONS

"Holder to Facilitate Visual Inspection of Ceramic Circuits"; Western Electric Technical Digest, No. 25; Jan. 1972; 2 pages; K. S. Kriat.

Primary Examiner—Stewart J. Levy
Assistant Examiner—Tom Noland
Attorney, Agent, or Firm—Laff, Whitesel, Conte & Saret

[57] ABSTRACT

An inspection board enables an inspector to accurately scan back and forth in both X and Y motions without having to take his eyes off an inspected workpiece or having to take his hands off the control handles for causing the scan. In some embodiments, an antistatic covering protects the workpiece against static charges which might otherwise build up as a result of a rubbing together of parts during the scanning motion. The inspection board has a particularly important utility when used to inspect printed circuit boards.

15 Claims, 10 Drawing Figures

HANDS-ON INSPECTION BOARD FOR PRINTED CIRCUIT CARDS

BACKGOUND OF THE INVENTION

This invention relates to inspection boards, especially—but not exclusively—for workpieces, such as printed circuit boards and, more particularly, to means for enabling a "hands-on" vertical and horizontal scanning of such workpieces without requiring interruptions for adjustment of the scanning means.

As used herein, a "hands-on" inspection board is one where an inspector can follow a predetermined inspection scan path without ever having to remove his hands from a control position used to move the board or his eyes from the workpiece being inspected.

The inventive inspection board is a tool used primarily, although not necessarily always, for the manufacture of workpieces, such as printed circuit boards. A characteristic of printed circuit boards is that they must be closely inspected for short circuits, for the integrity of construction, for good tinning, for a uniformly tinned surface within mounting holes, for completeness of soldering, and the like. A failure to find potential problems during such manufacturing inspection may lead to failures in the field. Therefore, to be sure that each and every incremental area of the printed circuit board is inspected, it is put onto a device called an "inspection board" which moves backward and forward, and up and down over a regular "scan" pattern which systematically presents every incremental area on the printed circuit board to the view of an inspector.

A problem heretofore encountered with inspection boards is that they require the inspector to stop periodically, as at the end of each horizontal scan, for example. There, the inspector adjusts a device, such as a lever on the side of the inspection board, or the like, in order to move the board vertically to scan the next horizontal section of the printed circuit board. This adjustment requires the inspector to take his hands off the inspection board guide handles and his eyes off the printed circuit board thereby breaking his concentration and the continuity and efficiency of his inspection. This stopping and adjusting is time consuming and disadvantageous in that it creates a diversion from the scanning and inspection of the printed circuit board, thereby causing a greater risk of error. Thus, there is a need for an inspection board which can be moved both horizontally and vertically by the inspector without requiring him to remove his eyes from the printed circuit board or his hands from the inspection board guide handles.

Accordingly, an object of this invention is to provide a new and improved inspection board, especially for use during the manufacture of printed circuit boards. A more particular object is to provide a means by which an inspector can vertically move the inspection board without having to stop in the midst of scanning, to adjust the vertical board position. In fact, an object of this invention is to provide inspection boards with a continuity of movement so that the inspector has continuity of concentration.

SUMMARY OF THE INVENTION

In keeping with an aspect of this invention, an inspection board is used to move the workpiece, such as a printed circuit board, over a predetermined path which systematically exposes each and every incremental area on the board to an inspector. This systematic scanning insures the continuity and integrity of the inspection, and therefore, of the workpiece itself. The inspection board has a platen which may be either transparent or opaque and which the inspector moves manually by manipulating guide handles. The platen moves horizontally under a magnifying glass to expose to view a first horizontal portion of the workpiece. At the end of the horizontal movement, the platen is slightly lifted by the guide handles, thus allowing it to slide vertically into the next lower vertical position for horizontally scanning the next lower horizontal portion of the workpiece. In a similar manner, the alternating horizontal and vertical scanning action is repeated until the entire board has been inspected.

The above mentioned and other features of this invention and the manner of obtaining them will become more apparent, and the invention itself will be best understood by reference to the following description of an embodiment of the invention taken in conjunction with the accompanying drawings, in which:

DESCRIPTION OF THE PREFERRED EMBODIMENT

Figure 1:
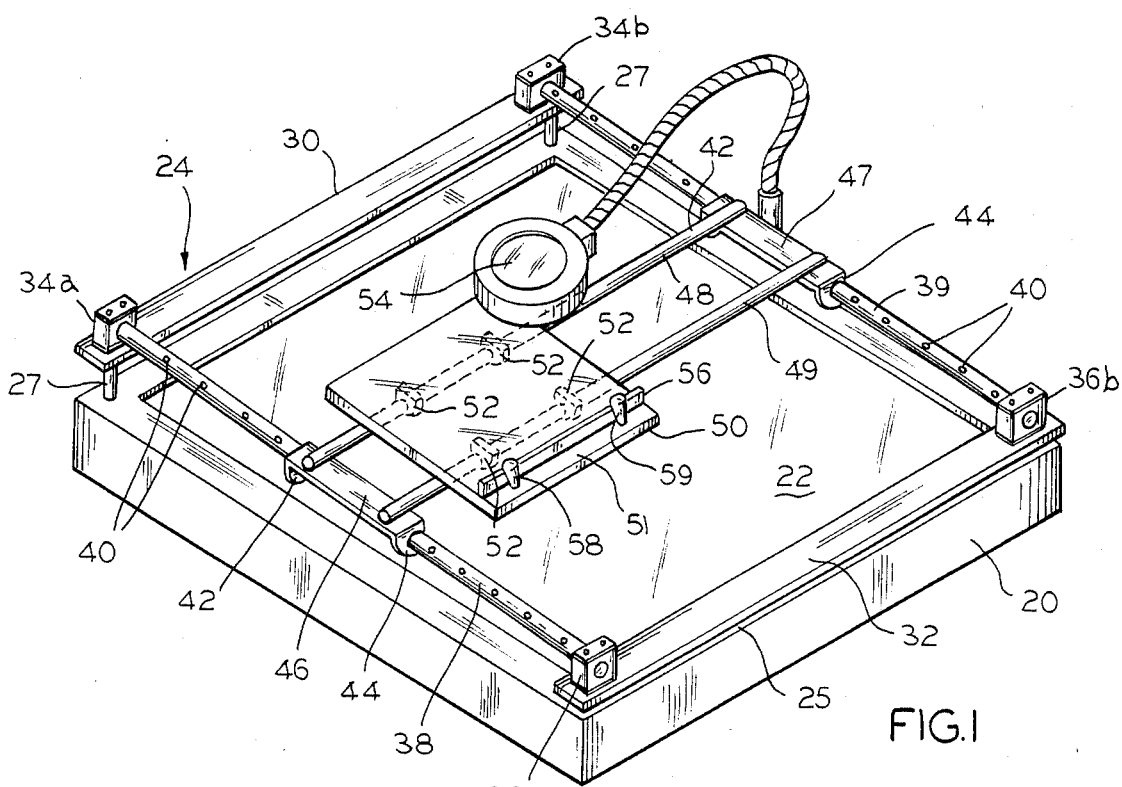
FIG. 1 is a perspective view of the inventive inspection board mounted over a light table.

As shown in FIG. 1, an inventive inspection board for workpieces, such as printed circuit boards, comprises an optional base or light table 20 which contains a light source and has a light transmitting top 22. Pivotally attached to or resting on this base 20 is a frame 24 forming a chassis for the inspection board. The frame 24 may be hinged or otherwise attach at its lower edge 25 to the optional base or light table 20. Or, frame 24 may simply rest on any suitable work surface. The upper edge of frame 24 is here shown as resting on two legs 27. However, any suitable support may be used to hold in a preferably raised position. The upper edge of the frame 24 may be raised or lowered to any comfortable work position, depending on the preference of the inspector.

The frame 24 is comprised of upper and lower horizontal supports 30 and 32, in a spaced parallel relationship. Upon each end of the upper and lower supports 30 and 32, upper mounting blocks 34 and lower mounting blocks 36 are attached. Extending between the upper and lower mounting blocks 34a, 36a respectively, is left side rail 38 and between blocks 34b, 36b is right side rails 39, in a spaced parallel relationship with rail 38.

Figure 7:
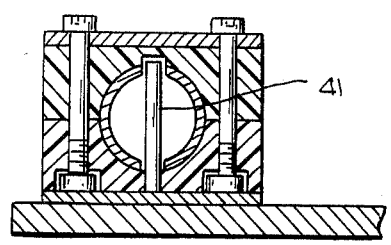
FIG. 7 is a cross-sectional view taken along Line 7—7 of FIG. 3 showing an aligning pin for aligning indexing stops or holes which incrementally controls the vertical scanning.

A series of uniformly spaced index stops or holes 40 are formed along the length of each of the guide rails 38, 39. As will become more apparent, each of these index stops or holes fixes a horizontal portion of the board which is inspected on each horizontal scan. Each of the guide rails 38, 39 is held in place, so that the indexing stops or holes 40 stay aligned along the top of the guide rail. This alignment of holes 40 is accomplished by an aligning pin 41 (FIG. 7) located on each of the four mounting blocks 34, 36. Each aligning pin 41 extends completely through the associated guide rails 38, 39 and emerges from its opposite side so that there is no chance for the guide rail to rotate.

On each guide rail 38, 39, attached by an upper sliding bearings 42 and lower sliding bearing 44, are platen guide rail support blocks 46, 47. The support blocks 46, 47 slide vertically up and down side guide rails 38, 39. Adhered to the top platen guide rail support blocks 46, 47 are two horizontal and parallel platen guide rods 48, 49 upon which platen 50 is attached by four platen sliding bearings 52. These bearings 52 are positioned a little closer to the top than the bottom of the platen 50 to cause it to rest stably under gravity, to reduce binding, and to make the platen slide easier.

The sliding shaft bearings 42, 44, support blocks 46, 47, horizontal guide rods 48, 49, sliding bearings 52, and platen 50 are all made from a methacrylate material, such as that sold under the trademark "Acrylic" by Rohm & Hass. It is important for all of these parts which give a traverse motion to the platen to be transparent. Thus, all of these parts may be placed over a light table and inspection will not be hampered by shadows of the traverse support mechanism. When an opaque "Acrylic" material is used, it is either black #2025 or white #7328 by Rohm & Hass. American Cyanamid is an alternative supplier.

Raised above the platen 50 and attached to frame 24 or supported by the optional base or light table 20 is an inspection means here shown in the form of magnifier 54 (FIG. 1) which the inspector uses to inspect a workpiece, such as a printed circuit board. The object of the invention is to pass each and every incremental area of the workpiece under this inspection means in order to insure a complete and systematic presentation of a workpiece resting on platen 50 to the view of an inspector who is looking through magnifier 54.

A small space above the lower edge 51 of the platen 50, a fence 56 is attached horizontally to receive and support the workpiece, such as a printed circuit board. Below the fence 56 and at either side of lower edge 51 of the platen 50 are attached two platen guide handles 58, 59 which the inspector grasps and uses to guide the platen in a scanning fashion.

In keeping with one aspect of this invention, the inspector uses the platen guide handles 58, 59 to guide the platen 50 horizontally across the platen guide rods 48, 49 and then vertically downwardly along transverse side guide rails 38, 39 to a next level to again guide platen 50 horizontally across the platen guide rods 48.

Figure 2:
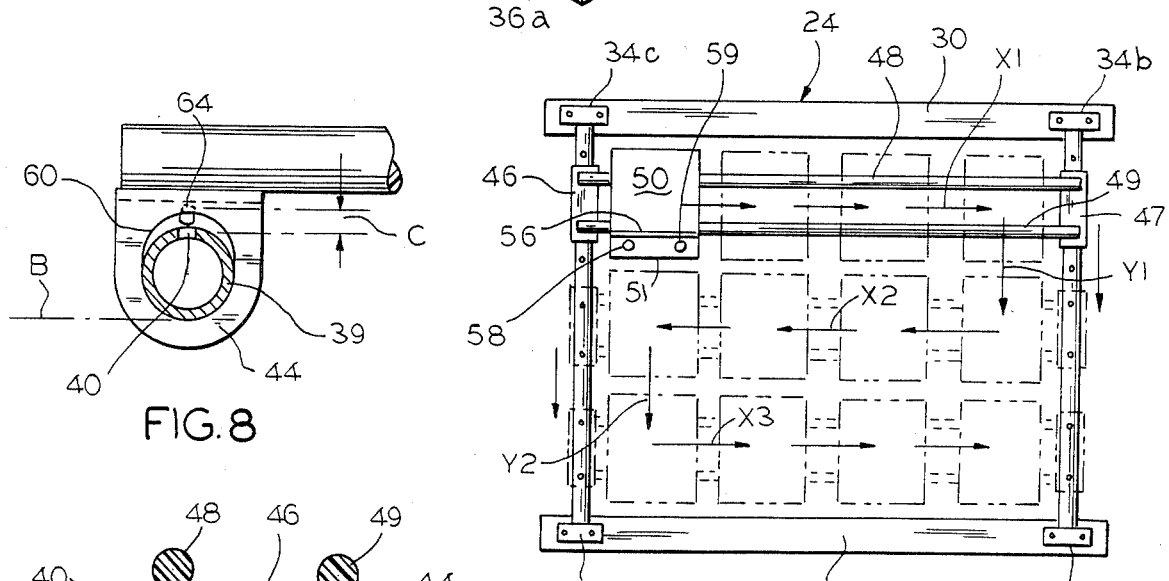
FIG. 2 is a plan view of the inspection board schematically showing the scanning pattern.
Figure 9:
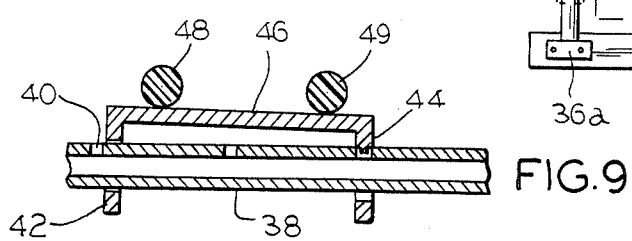
FIG. 9 is a cross-section view showing shaft bearings with a guide pin in place.

More particularly, FIG. 2 shows the systematic scan pattern that is used to present each area of the platen 50 to the inspector's view. First, the inspector places platen 50 in a start position. Then, he holds handles 58, 59 and moves the platen along horizontal rods 48, 49 in the direction X1. At the right-hand end of the X1 scan, he raises the handles 48, 49 upwardly and the support blocks 46, 47 slide under gravity down the side rails 38, 39 in movement Y1, where an indexing stop or hole 40 limits the downward movement. Next, the inspector moves the platen in direction X2 in a horizontal scan to the left-hand end of the scan pattern, where he raises the handles upwardly to cause the vertical movement Y2, following which he makes the horizontal scan X3. In this manner, there is a systematic presentation of each incremental area of the platen to the view of the inspector as he looks through magnifier 54.

In greater detail, the upper surface of each of the side rails 38, 39 has a series of periodically recurring indexing stops or holes 40 formed at predetermined intervals. The distance between index holes 40 establishes the incremental amount of "Y" movement (e.g. Y1, Y2) in each vertical scanning step.

Figure 8:
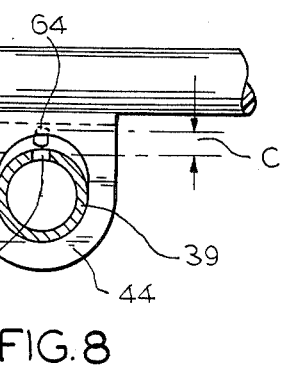
FIG. 8 is an elevation view, partly in cross-section, showing a latch or pin lifted out of an indexing stop or hole preparatory for the next vertical scanning motion of the platen.
Figure 6:
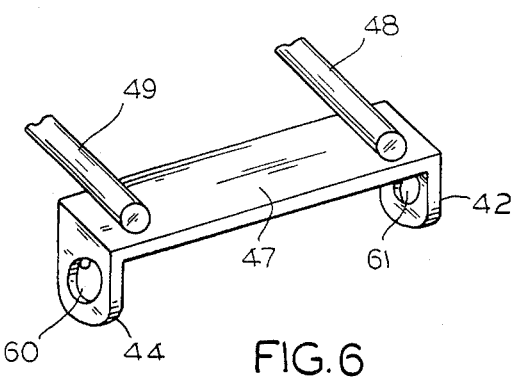
FIG. 6 is a perspective view of a fragmentary part of the inspection board shaft bearings.

Each of the upper and lower support blocks 46, 47 have sliding bearings 42, 44 depending therefrom. The upper sliding bearing 42 has a substantially circular hole 61 (FIG. 6) therein, through which the circular cross section of guide rails 38, 39 slip, relatively loosely. The lower sliding bearing 44 has an elongated or somewhat elliptical hole 60 (FIG. 8) which enables the bearing to be lifted in an upward direction (FIGS. 8, 10) or to be set down and rested upon the side rails 38, 39. Latching means in the form of an indexing pin 64 is embedded in the sliding bearings 44, at the top of the elongated hole 60. It is important to note that the bottom edges of the circular and elongated holes in both the upper and lower bearings 42, 44 are aligned at B, as shown in FIG. 8. The top edge of the elongated hole is raised, as shown at C. The latch pin 64 at the top of the elongated hole 60 slides along the top of rails 38, 39 during the vertical scanning motion. Thus, the platen 50 rides along the bottom edges of the bearing holes during sliding.

The lengths of latch pin 64 and of the hole 60 elongation C are such that the latch pin 64 is lifted out of the indexing hole 40 so that it may slide freely over the top surfaces of the side rails 38, 39. When lifted, support block 46 tips (FIG. 10) and the latching pin 64 is projecting at a slight angle. The free end of pin 64 should be chamferred or rounded into a dome of similar shape so that it will be guided and directed into the hole 40. Therefore, at the time when latch pin 64 locks in, there is an improved mechanical movement.

As the sliding bearings 44 slip downwardly, the latch pin 64 drops into the next stop or hole 40 that it encounters, unless it is then being held in an elevated position by handles 58, 59. Thus, latch pin 64 collides with and bears against the wall of the stop or hole 40 to terminate each of the downwardly vertical scanning motions.

The latch pin 64 in the top of the elliptical hole 60, should be made from a material which will not shear responsive to repeated collisions with the holes 40. One such material is a polycarbonate plastic sold under the trademark "Lexan". Polycarbonate is the material used to make most football helmets. For pin 64, plastic is preferred over metal for production reasons and since plastic will not hammer the edges of holes 40 out of shape.

To facilitate the sliding, each of the guide rails 38, 39 may be treated to give it a fine, smooth, friction free surface. When the guide rails 38, 39 are made of aluminum, this smoothness may be achieved by first etching off all foreign materials and then anodizing the cleaned rails. Next, a permanent film TFE lubricant flourocarbon resin coating is sprayed over the anodized rails. This spray contains 20% of an active ingredient in the form of a white waxy tetrafloureothylene telomer in a freon TF solvent. The spray is manufactured by Crown Industrial Products. The effect is a dry transparent film which is somewhat similar to lubricating the rails. When so treated, the side rails will not accumulate a film of dirt in the field, which might otherwise impede the Y motion sliding movement.

Many of the components used in modern electronic circuits have a low voltage rating which is easily exceeded by the voltage level of a normal static charge that may build up. Therefore, without an antistatic feature, it is possible that these low voltage components could be burned out simply by laying them on the platen. To avoid such a burn out, either bar 56 may be made of an electrically conductive material or a self-adhesive tape of antistatic material may be used to cover the bar 56 and a mat of antistatic material may cover platen 50. That conductive bar or antistatic material is grounded either by a ground wire or through the metal of the structure. Of these two antistatic protectors, the film on fence 56 is perhaps a little more important since connector points are usually brought out to the side of a printed circuit board and those connectors will make contact with fence 56. Antistatic material which has been successfully used is sold by the 3M Company under the trademark "Velostat". It is a plastic impregnated with metal to make it conductive.

The operation of the inventive inspection board should now be clear. The inspector moves the platen 50 to a starting point, such as an upper left-hand corner of the table frame 24, as seen in FIG. 2. Then, the magnifier is positioned over a starting part of the platen, such as the lower right-hand corner, in this example. A workpiece, such as a printed circuit board, is placed against the fence 56 on the platen 50 and the part under the magnifier is inspected. The light from table 22 passes through the mounting holes in the printed circuit board so that a layer of tin plating inside the holes may be inspected.

After that section of the board is inspected, the handles 58, 59 are used to slide the platen 50 to the right, over the path X1.

Figure 10:
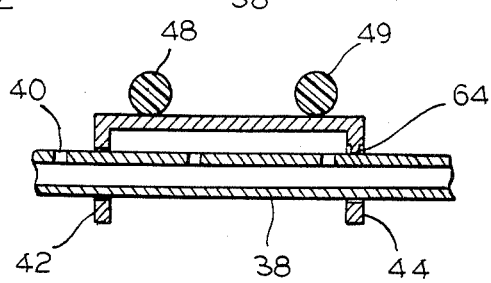
FIG. 10 is a similar cross-section view showing the shaft bearings with a guide latch or pin lifted out of the indexing stop or hole preparatory for movement.
Figure 3:
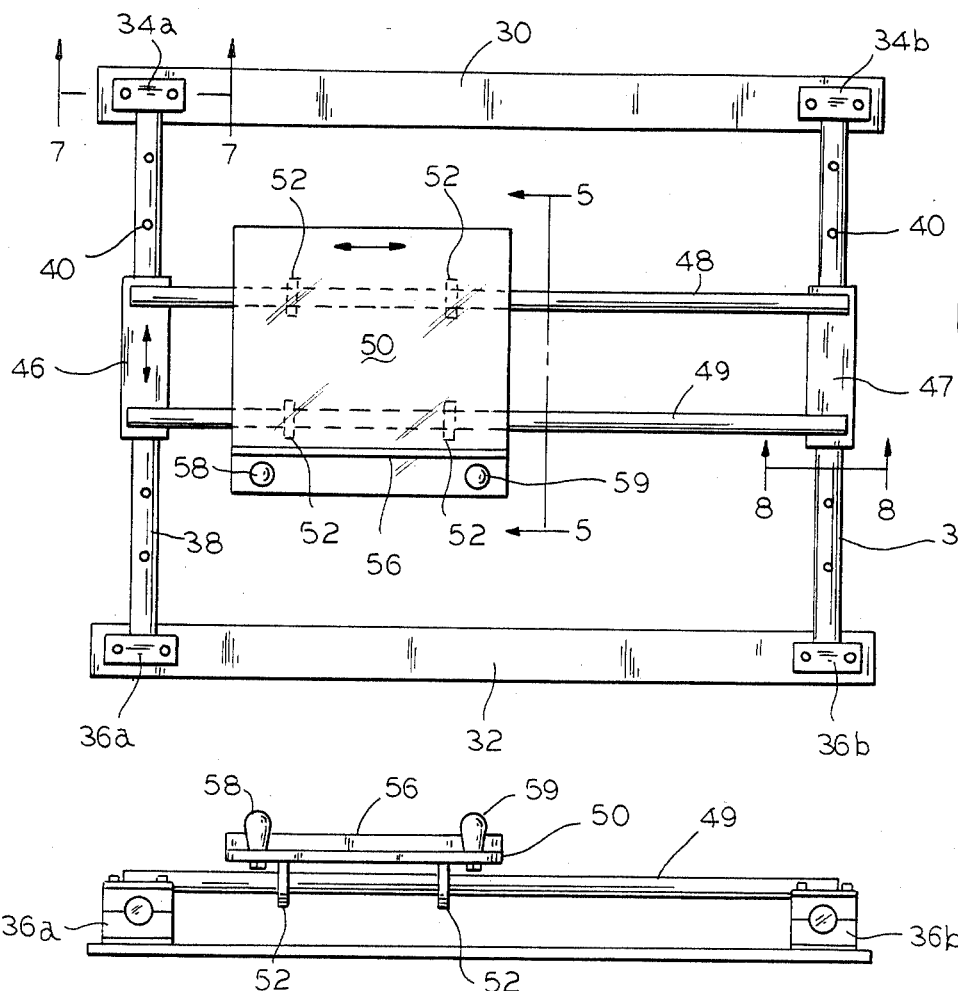
FIG. 3 is a plan view of the inspection board.
Figure 4:
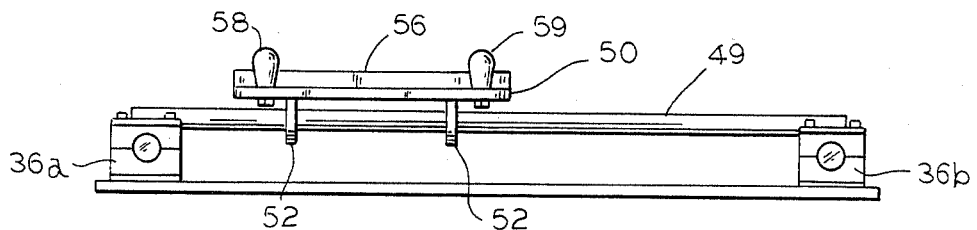
FIG. 4 is a side elevation view of the lower side of the inspection board.
Figure 5:
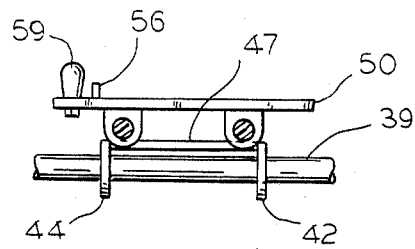
FIG. 5 is a fragmentary side elevation taken along Line 5—5 of FIG. 3.

When an inspector finishes the first horizontal scan X1 (FIG. 2), the printed circuit board moves out from under the view through magnifier 54. Then he lifts the guide handles 58, 59 at the lower edge 51 of the platen thereby lifting indexing pin 64 out of the indexing stop or hole 40, as shown in FIGS. 8 and 10.

When the indexing latch pins 64 leave the indexing holes 60, gravity causes the structure 42-52 and platen 50 to slide vertically down the transverse side rails 38, 39, in motion Y1. When the next set of indexing stops or holes 40 is reached, latch pins 64 drop into them, thereby stopping the downward slide and securing platen 50 in position for another horizontal scan X2 (FIG. 2). As the platen is moved over the paths X1, Y1, X2, Y2, X3, each incremental area of the surface of the workpiece, such as a printed circuit board, is inspected. This process is continued until every incremental area of the workpiece is scanned and inspected.

Of course, it should be understood that the inspector controls the width of the scan in the X-direction. It may be as wide or as narrow as the width of the inspected board.

It is important to note that the entire scan may be performed by moving the handles 58, 59 back and forth, and by raising them upwardly briefly as soon as the edge of the printed circuit board comes into view and is inspected. There is no need for the inspector to take his eyes off the board or his hands off the handles 58, 59. This is a convenience for the inspector. However, the primary benefit is that there is no distraction which forces the inspector to glance away or to handle another device for causing an incremental vertical scan.

When a finished workpiece, such as a printed circuit board, is inspected, there may be no need to inspect the inside of the mounting holes for tinning, prior to soldering, because component leads now fill the holes and the soldering is completed. Moreover, the inspector might be distracted by background objects which a transparent platen could expose to view. For example, it might be confusing to see a loose resistor on a table under a printed circuit board having the same kind of resistors mounted thereon. Therefore, on occasions, it may or may not be preferable to substitute an opaque platen for the transparent one. In this case, either a black or a white acrylic board is preferred as a substitute for the transparent platen 50, described above.

Those who are skilled in the art will readily perceive how to modify the invention. Therefore, the appended claims are to be construed to cover all equivalent structures which fall within the true scope and spirit of the invention.

The claimed invention is:

1. A hands-on inspection board comprising a spaced parallel pair of side rails, each of said side rails having a series of uniformly spaced stops distributed along the length thereof, a sliding support having upper and lower sliding bearings associated with each of said side rails, said side rails being threaded through openings in said sliding bearings, the opening in one of said sliding bearings having a cross section conforming to the cross section of said side rail, the opening in the other of said sliding bearings being elongated so that either gravity may make the top of said elongated bearing opening rest on the top of said side rail or an inspector may lift said other slide bearing to make the bottom of said elongated bearing opening rest on the bottom of said side rail, latch means associated with the top of said elongated opening for engaging said stop means, and a platen mounted on rods extending between said sliding supports for enabling a back and forth platen traverse across said rods and between said side rails.

2. The inspection board of claim 1 and means for mounting said side rails at an incline which causes said sliding bearings to slide downwardly under gravity each time that said inspector lifts said other slide bearing to remove said latch means from said stop, said downward slide continuing until said latch means engages the next of said stops.

3. The inspection board of claim 1 and inspection means positioned over said platen whereby each incremental area of said platen is presented to said inspection means as said platen is moved.

4. The inspection board of claim 3 wherein said stop means are a series of holes formed along the top of said side rails and said latch is a pin projecting downwardly from the top of said elongated opening, said pin fitting into said hole.

5. The inspection board of claim 4 wherein said pin is made of a plastic material having characteristics which resists shear forces that occur when said pin falls into and collides with said holes to stop said downward slide, without hammering the edge of said holes out of shape.

6. The inspection board of claim 3 wherein said latch pin has a rounded end to facilitate an engagement between said pin and said hole.

7. The inspection board of claim 1 and antistatic means covering at least some of said platen.

8. The inspection board of claim 1 and fence means extending along an edge of said platen for holding a workpiece thereon, and antistatic means covering said fence.

9. The inspection board of claim 1 wherein said side rails are anodized aluminum covered with a film of tetrafloureothylene.

10. The inspection board of claim 1 wherein said platen and said rods have associated parts for enabling said traverse, all of said parts including said platen and said rods being transparent, and a source of light can be positioned under said platen, rods, and parts.

11. An inspection board comprising an inclined pair of spaced parallel side rails, a pair of spaced parallel guide rods perpendicular to and slidably mounted on said side rails, upper and lower bearings sliding on each of said side rails for supporting said guide rods, the lower one of said slide bearings being somewhat elongated, and latch means in said elongated sliding bearing, a plurality of stop means distributed along the length of said side rail to engage said latch means, there being a sufficient amount of play in said elongated slide bearing to enable it to be lifted relative to said side rail far enough to lift said latch out of said stop means, which disengages said latch means from stop means responsive to said lifting, whereby gravity causes said slide bearings to slide downwardly on said side rails until said latch means engages another stop means.

12. The inspection board of claim 11 wherein said stop means are a series of holes formed along the top of said side rails and said latch is a pin projecting downwardly from the top of said elongated slide bearing, said pin fitting into said hole.

13. The inspection board of claim 12 wherein said latch pin is pointed at a slight angle by lifting said platen to facilitate an engagement between said pin and said hole.

14. The inspection board of claim 13 wherein said pin is made of a polycarbonate material which resists shear forces that occur when said pin falls into and collides with said holes to stop said downward slide, without hammering the edge of said holes out of shape.

15. The inspection board of claim 14 and antistatic means corvering at least some of said platen, and fence means extending along an edge of said platen for holding a workpiece thereon, and antistatic means covering said fence.

* * * * *